(12) United States Patent
Ozawa et al.

(10) Patent No.: US 9,137,910 B2
(45) Date of Patent: Sep. 15, 2015

(54) ELECTRICAL JUNCTION BOX

(75) Inventors: Keisuke Ozawa, Makinohara (JP); Hidemasa Yoshida, Toyota (JP)

(73) Assignee: Yazaki Corporation, Tokyo (JP)

( * ) Notice: Subject to any disclaimer, the term of this patent is extended or adjusted under 35 U.S.C. 154(b) by 58 days.

(21) Appl. No.: 14/344,442

(22) PCT Filed: Sep. 11, 2012

(86) PCT No.: PCT/JP2012/005737
§ 371 (c)(1),
(2), (4) Date: Oct. 17, 2014

(87) PCT Pub. No.: WO2013/038652
PCT Pub. Date: Mar. 21, 2013

(65) Prior Publication Data
US 2015/0047868 A1    Feb. 19, 2015

(30) Foreign Application Priority Data
Sep. 13, 2011   (JP) .................................. 2011-199166

(51) Int. Cl.
*H05K 5/02*       (2006.01)
*H01R 13/453*     (2006.01)
(Continued)

(52) U.S. Cl.
CPC .............. *H05K 5/02* (2013.01); *H01R 13/4534* (2013.01); *H01R 13/639* (2013.01); *H01R 13/641* (2013.01); *H05K 5/0221* (2013.01)

(58) Field of Classification Search
CPC ........... H02G 3/08; H02G 3/081; H02G 3/14; H02G 3/16; H05K 5/00; H05K 5/02; H05K 5/0221; H01R 13/64; H01R 13/4534; H01R 13/639; H01R 13/641

USPC .......... 174/50, 520, 59, 17 R, 559, 535, 542, 174/560, 561, 563; 220/3.2–3.9, 4.02; 439/76.1, 76.2, 135, 157, 352, 347, 439/620.27, 620.29
See application file for complete search history.

(56) References Cited

U.S. PATENT DOCUMENTS 5,207,593 A * 5/1993 Bogiel ........................... 439/352
5,748,068 A * 5/1998 Kiyota ...................... 439/620.29
(Continued)

FOREIGN PATENT DOCUMENTS

EP       1378970 A1    1/2004
JP     2004-039367 A   2/2004

OTHER PUBLICATIONS

International Search Report and Written Opinion mailed Nov. 28, 2012, issued for PCT/JP2012/005737.

*Primary Examiner* — Angel R Estrada
(74) *Attorney, Agent, or Firm* — Locke Lord LLP

(57) ABSTRACT

An electrical junction box includes: a sliding member slidable between a second position where a first connector is allowed to be inserted into a first connector fitting portion, and a first position where the first connector regularly fitted to the first connector fitting portion is held between the sliding member and the first connector fitting portion, and a second connector is allowed to be inserted into a second connector fitting portion; and a locking projection with which a locking arm of the sliding member is locked. The locking projection includes: a first inclined wall inclined in a direction away from the first connector fitting portion as extended toward the first connector fitting portion from the second connector fitting portion; a second inclined wall inclined in a direction approaching the first connector fitting portion; and a third wall perpendicular to an outer surface of the first connector fitting portion.

2 Claims, 7 Drawing Sheets

(51) Int. Cl.
*H01R 13/639* (2006.01)
*H01R 13/641* (2006.01)

(56) References Cited

U.S. PATENT DOCUMENTS

| | | | |
|---|---|---|---|
| 5,795,193 A * | 8/1998 | Yang | 439/620.27 |
| 6,113,414 A | 9/2000 | Fukuda | |
| 6,121,548 A * | 9/2000 | Matsuoka | 174/59 |
| 6,126,458 A * | 10/2000 | Gregory et al. | 439/76.2 |
| 6,570,088 B1 * | 5/2003 | Depp et al. | 174/50 |
| 6,786,740 B2 * | 9/2004 | Ito | 439/76.2 |
| 6,896,528 B2 * | 5/2005 | Kubota et al. | 439/135 |
| 7,429,700 B2 * | 9/2008 | Kanamaru et al. | 174/50 |
| 7,632,110 B2 * | 12/2009 | Kanou et al. | 439/76.2 |
| 7,892,011 B2 * | 2/2011 | Beer | 439/347 |
| 2004/0005804 A1 | 1/2004 | Kubota et al. | |

* cited by examiner

ELECTRICAL JUNCTION BOX

TECHNICAL FIELD

This invention relates to an electrical junction box having a structure configured to surely fit a connector as a component of an air-bag operational circuit or the like to a connector fitting portion.

BACKGROUND ART

Various electronic devices are mounted on a vehicle or the like. An electrical junction box is arranged in a proper position of the vehicle for supplying electric power and transmitting signals to the various electronic devices. Incidentally, in the present invention, hereinafter, a junction block (also referred to as a junction box), a fuse block (also referred to as a fuse box), and a relay block (also referred to as a relay box) are collectively referred to as the electrical junction box.

Various structures of the electrical junction box are used corresponding to a vehicle type. For example, as shown in FIG. 9, there is an electrical junction box 201 having a sliding member 202 for surely fitting a first connector 207 as a component of an air-bag operational circuit to a first connector fitting portion 211 (see PTL 1).

In the electrical junction box 201, a first connector fitting portion 211 to be fitted to the first connector and a second connector fitting portion 212 to be fitted to a not-shown second connector are arranged in one direction. Further, the sliding member 202 is attached to an outer surface 230 of a case 203 in a manner slidable in the one direction between a second position where the first connector 207 is allowed to be inserted into the first connector fitting portion 211, and the second connector is prevented from being inserted into the second connector fitting portion 212, and a first position where the first connector 207 regularly fitted to the first connector fitting portion 211 is held between the sliding member 202 and the first connector fitting portion 211, and the second connector is allowed to be inserted into the second connector fitting portion 212. Further, FIG. 9 shows a condition that the sliding member 202 is positioned in the second position, and an arrow X in FIG. 9 denotes the one direction.

Further, a locking arm 223 is provided on the sliding member 202, and a locking projection 204 with which the locking arm is locked when the sliding member 202 is positioned in the first position is provided on the outer surface 230 of the case 203.

As shown in FIGS. 10A to 10D, the locking projection 204 includes: an inclined wall inclined in a direction away from the outer surface 230 as extended toward the first connector fitting portion 211 from the second connector fitting portion 212; a planar wall 242 continued to the inclined wall 241 and parallel to the outer surface 230; and a vertical wall 243 continued to the planar wall 242 and perpendicular to the outer surface 230.

When the sliding member 202 is slid from the second position to the first position, as shown in FIG. 10A, a tip of the locking arm 223 is slid on the inclined wall 241 of the locking projection 204. Then, as shown in FIGS. 10B and 10C, the tip of the locking arm 223 is moved along the planar wall 242 of the locking projection 204. Then, as shown in FIG. 10D, the tip of the locking arm 223 is moved beyond the planar wall 242 of the locking projection 204, and the locking arm 223 is locked with the locking projection 204.

Further, when the electrical junction box 201 is assembled, firstly, while the sliding member 202 is positioned in the second position, the first connector 207 is inserted into and fitted to the first connector fitting portion 211. Next, the sliding member 202 is positioned in the first position, and the second connector is inserted into and fitted to the second connector fitting portion 212. At this time, when the first connector 207 is halfway fitted to the first connector fitting portion 211, the sliding member 202 is abutted on a sidewall of the first connector 207, and cannot be positioned in the first position, and the second connector cannot be inserted into the second connector fitting portion 212.

In this way, in the electrical junction box 201, when a fitting operation of the second connector to the second connector fitting portion 212 is finished, it is ensured that the first connector 207 is regularly fitted to the first connector fitting portion 211. Further, by pressing by the sliding member 202 positioned in the first position, the first connector 207 is prevented from falling out of the first connector fitting portion 211.

CITATION LIST

Patent Literature

[PTL 1]
JP, A, 2004-39367

SUMMARY OF INVENTION

Technical Problem

However, in the electrical junction box 201, there is a problem described below. Namely, there is a problem that despite a half-locking condition that the locking arm 223 is positioned along the planar wall 242 of the locking projection 204, due to a dimension error in manufacturing, the second connector may be inserted into the second connector fitting portion 212, and the half-locking condition of the locking arm 223 may be overlooked.

Accordingly, an object of the present invention is to provide an electrical junction box able to prevent a half-locking condition of a sliding member.

Solution to Problem

For attaining the object, according to a first aspect of the present invention, there is provided an electrical junction box including:
a first connector fitting portion configured to be fitted to a first connector;
a second connector fitting portion configured to be fitted to a second connector;
said first and second connector being arranged in one direction, and
a sliding member attached to an outer surface of the first fitting portion and an outer surface of the second fitting portion in a manner slidable in the one direction,
wherein the sliding member is slidable between a second position where the first connector is allowed to be inserted into the first connector fitting portion, and the second connector is prevented from being inserted into the second connector fitting portion, and a first position where the first connector regularly fitted to the first connector fitting portion is held between the sliding member and the first connector fitting portion, and the second connector is allowed to be inserted into the second connector fitting portion,
wherein a locking projection with which a locking arm provided on the sliding member is locked is provided on the outer surface of the first connector fitting portion, and wherein the locking projection includes:
a first inclined wall inclined in a direction away from the outer surface of the first connector fitting portion as extended toward the first connector fitting portion from the second connector fitting portion;
a second inclined wall continued to the first inclined wall and inclined in a direction approaching the outer surface of the first connector fitting portion as extended toward the first connector fitting portion from the second connector fitting portion; and
a third wall continued to the second inclined wall and perpendicular to the outer surface of the first connector fitting portion.

According to a second aspect of the present invention, there is provided the electrical junction box as described in the first aspect,
wherein when the first connector is fitted halfway to the first connector fitting portion, the locking arm cannot be positioned in the first position and on the second inclined wall, and
wherein when the locking arm is positioned on the first inclined wall, the second connector cannot be inserted into the second connector fitting portion.

Advantageous Effects of Invention

According to the invention as described in the first aspect, a locking projection with which a locking arm provided on the sliding member is locked is provided on the outer surface of the first connector fitting portion, and the locking projection includes: a first inclined wall inclined in a direction away from the outer surface of the first connector fitting portion as extended toward the first connector fitting portion from the second connector fitting portion; a second inclined wall continued to the first inclined wall and inclined in a direction approaching the outer surface of the first connector fitting; portion as extended toward the first connector fitting portion from the second connector fitting portion; and a third wall continued to the second inclined wall and perpendicular to the outer surface of the first connector fitting portion. Therefore, while the locking arm is positioned on the first inclined wall, when the movement of the sliding member is stopped, due to elastic restoring force of the bent locking arm and to a guide of the first inclined wall, the sliding member is moved to the second position side. Further, while the locking arm is positioned on the second inclined wall, when the movement of the sliding member is stopped, due to elastic restoring force of the bent locking arm and to a guide of the second inclined wall, the sliding member is moved to the first position side. In this way, in any case, the locking arm is not stopped on the locking projection, therefore the electrical junction box configured to prevent the half-locking condition of the sliding member is provided.

According to the invention as described in the second aspect, when the first connector is fitted halfway to the first connector fitting portion, the locking arm cannot be positioned in the first position and on the second inclined wall, and when the locking arm is positioned on the first inclined wall, the second connector cannot be inserted into the second connector fitting portion. Therefore, when the second connector is inserted into the second connector fitting portion, the locking arm is positioned in the first position or on the second inclined wall. Similar to the first aspect, when the locking arm is positioned on the second inclined wall, the sliding member is moved to the first position.

BRIEF DESCRIPTION OF DRAWINGS

FIG. 1 is a plan view showing an electrical junction box according to an embodiment of the present invention.
FIG. 2 is a side view showing the electrical junction box shown in FIG. 1.
FIG. 3 is an enlarged perspective view showing a first connector fitting portion, a second connector fitting portion, and a sliding member shown in FIG. 2.
FIG. 4 is a perspective view showing the first connector fitting portion, the second connector fitting portion, and the sliding member shown in FIG. 3 from a different angle.
FIG. 5 is a plan view showing a locking projection shown in FIG. 3.
FIG. 6 is an explanatory view for explaining a condition that a locking arm of the sliding member shown in FIG. 3 is about to be locked with the locking projection, and a tip of the locking arm is positioned on a first inclined wall of the locking projection.
FIG. 7 is an explanatory view for explaining a condition that a locking arm of the sliding member shown in FIG. 3 is about to be locked with the locking projection, and the tip of the locking arm shown in FIG. 6 is positioned at a top of the locking projection.
FIG. 8 is an explanatory view for explaining a condition that a locking arm of the sliding member shown in FIG. 3 is about to be locked with the locking projection, and the locking arm overrides a second inclined wall of the locking projection and locked with the locking projection.
FIG. 9 is a plan view showing a conventional electrical junction box having a sliding member.
FIG. 10A is an explanatory view for explaining a condition that a locking arm of the sliding member shown in FIG. 9 is about to be locked with a locking projection, and a tip of the locking arm is positioned on an inclined wall of the locking projection.
FIG. 10B is an explanatory view for explaining a condition that the locking arm of the sliding member shown in FIG. 9 is about to be locked with the locking projection, and the tip of the locking arm is about to run on a planar wall of the locking projection.
FIG. 10C is an explanatory view for explaining a condition that the locking arm of the sliding member shown in FIG. 9 is about to be locked with the locking projection, and the tip of the locking arm runs on the planar wall of the locking projection.
FIG. 10D is an explanatory view for explaining a condition that the locking arm of the sliding member shown in FIG. 9 is about to be locked with the locking projection, the tip of the locking arm overrides the planar wall of the locking projection, and the locking arm is locked with the locking projection.

DESCRIPTION OF EMBODIMENTS

An electrical junction box 1 according to an embodiment of the present invention will be explained with reference to FIGS. 1 to 8.

Figure 1:
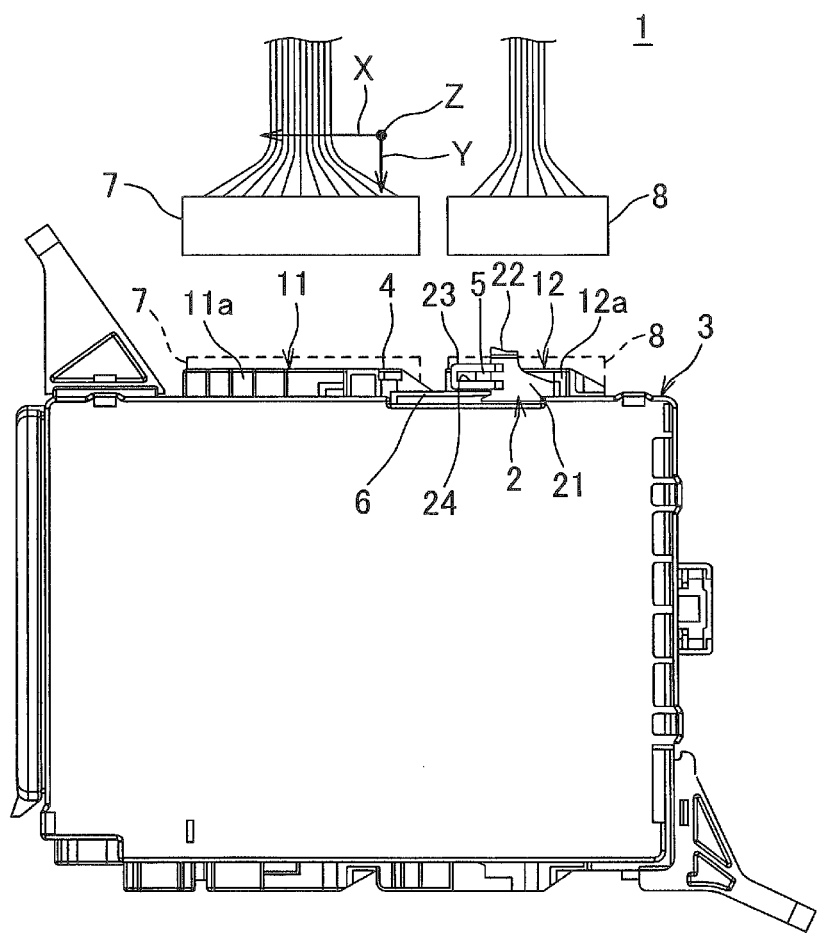
[FIG. 1]

The electrical junction box 1 of the present invention is mounted on a vehicle, supplies electric power and transmits signals to electronic devices mounted on the vehicle. As shown in FIG. 1, the electrical junction box 1 includes: a rectangular-box-shaped case 3; a substrate and a plurality of electronic components received in the case 3; first and second connector fitting portions 11, 12 provided on a sidewall of the case 3 and arranged in a longitudinal direction of the case 3; and a sliding member 2 slidable in the longitudinal direction of the case 3 and attached to outer surfaces of the first and second connector fitting portions 11, 12.

Further, an arrow X in FIG. 1 denotes the longitudinal direction of the case 3. An arrow Y denotes a width direction of the case 3. An arrow Z denotes a thickness direction of the case 3. These arrows X, Y, and Z are perpendicular to each other.

Figure 2:
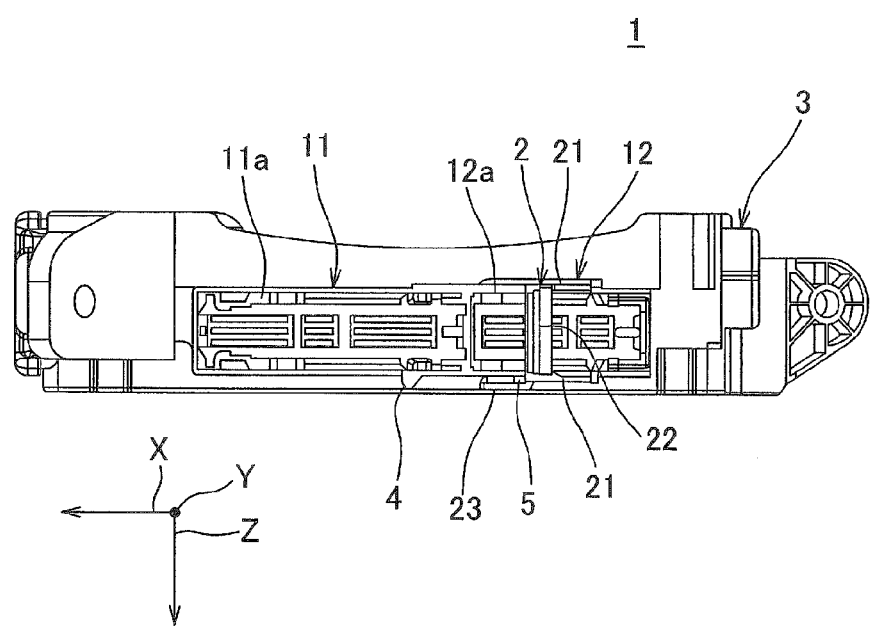
[FIG. 2]

As shown in FIG. 2, the first connector fitting portion 11 includes: a plurality of terminals; and a synthetic-resin-made female-type connector housing 11a holding these terminals. One end of each terminal is electrically connected to the substrate, and the other end is positioned in the connector housing 11a. One end of the connector housing 11a is positioned in the case 3, and the other end is positioned outside of the case 3. A male-type first connector 7 provided on an end of a wiring harness is fitted to the first connector fitting portion 11 (fitting condition is shown by dot line in FIG. 1). Further, the first connector fitting portion 11 and the first connector 7 are components of a circuit to operate an air-bag.

As shown in FIG. 2, the second connector fitting portion 12 includes: a plurality of terminals; and a synthetic-resin-made female-type connector housing 12a holding these terminals. One end of each terminal is electrically connected to the substrate, and the other end is positioned in the connector housing 12a. One end of the connector housing 12a is positioned in the case 3, and the other end is positioned outside of the case 3. A male-type second connector 8 provided on an end of a wiring harness is fitted to the second connector fitting portion 12 (fitting condition is shown by dot line in FIG. 1).

Further, the first and second connectors 7, 8 are respectively fitted to the first and second connector fitting portions in the arrow Y direction.

Figure 3:
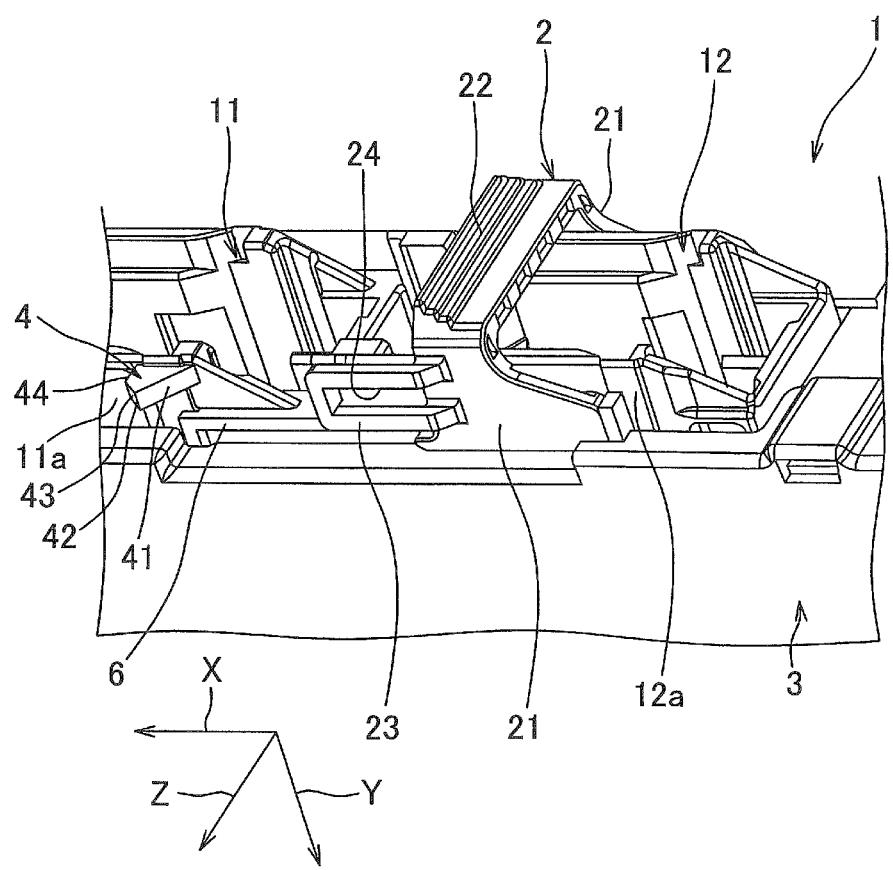
[FIG. 3]
Figure 4:
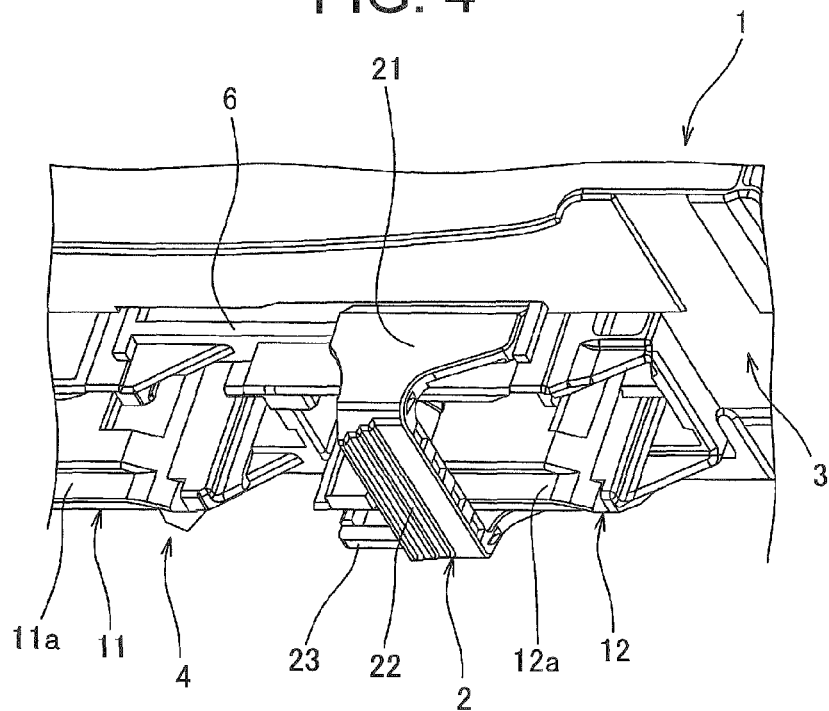
[FIG. 4]

The sliding member 2 ensures the fitting of the first connector 7 to the first connector fitting portion 11, prevents the first connector 7 from falling out, and is made of synthetic resin. As shown in FIGS. 2 to 4, the sliding member 2 includes: a pair of attaching portions 21 facing each other to position the connector housings 11a, 12a therebetween; a joint portion 22 joining the pair of attaching portions 21 to each other; and a locking arm 23 extended in the arrow X direction from one of the attaching portions 21.

A concave groove extended in the arrow X direction is provided on each of inner surfaces facing each other of the pair of attaching portions 21. Further, a pair of ribs 6 extended in the arrow X direction and positioned in the concave groove is provided on outer surfaces of the connector housings 11a, 12a. The sliding member 2 is slid along the rib 6 from one end to the other end of the rib 6.

As shown in FIG. 3, while the attaching portions 21 are positioned at one end of the rib 6, the joint portion 22 is positioned around an opening of the connector housing 12a to prevent the second connector 8 from being inserted into the second connector fitting portion 12. Further, in this condition, the joint portion 22 allows the first connector 7 to be inserted into the first connector fitting portion 11. In the present invention, one end of the rib 6, namely, an end of the second connector fitting portion 12 is referred to as "second position".

Further, while the attaching portions 21 are positioned at the other end of the rib 6, the joint portion 22 is positioned around an opening of the connector housing 11a to hold the first connector 7 regularly fitted to the first connector fitting portion 11 between the joint portion 22 and the first connector fitting portion 11. Thereby, the first connector 7 fitted to the first connector fitting portion 11 is prevented from falling out. Further, in this condition, the joint portion 22 allows the second connector 8 to be inserted into the second connector fitting portion 12. In the present invention, the other end of the rib 6, namely, an end of the first connector fitting portion 11 is referred to as "first position".

Further, in a case that the first connector 7 is fitted halfway to the first connector fitting portion 11, when the sliding member 2 is slid from the second position to the first position, the joint portion 22 is abutted on a sidewall of the first connector 7 and the sliding member 2 cannot be positioned in the first position, thereby the second connector 8 cannot be inserted into the second connector fitting portion 12. Therefore, when the fitting operation of the second connector 8 to the second connector fitting portion 12 is finished, the regular fitting of the first connector 7 to the first connector fitting portion 11 is ensured. Further, "fitted halfway" means a condition that the first connector 7 is not fully inserted into the connector housing 11a of the first connector fitting portion 11.

Figure 8:
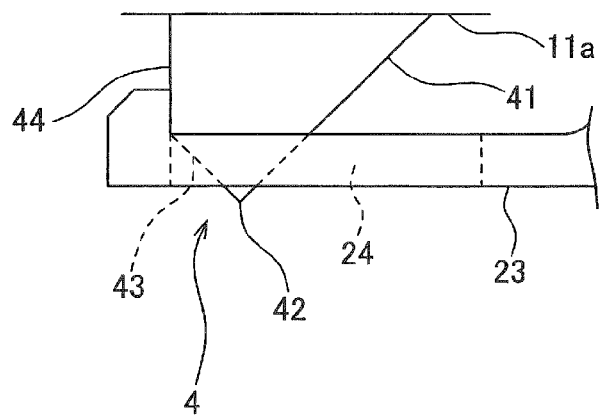
[FIG. 8]
Figure 9:
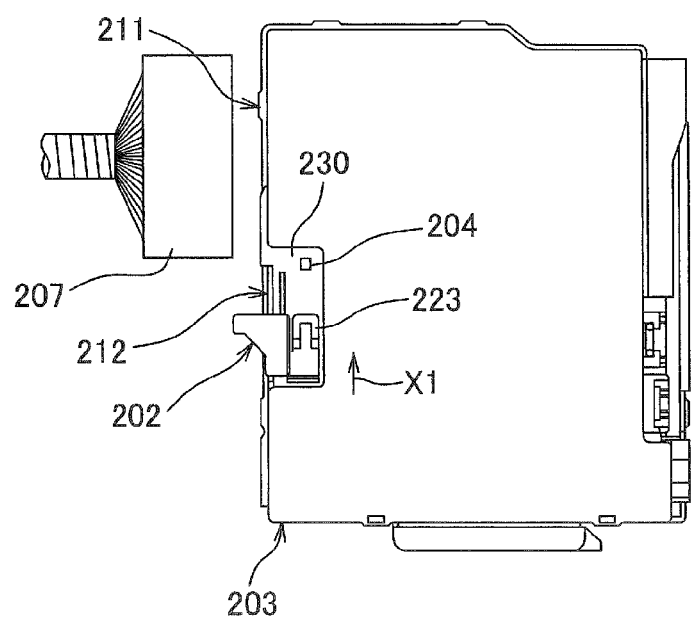
[FIG. 9]
Figure 10A:
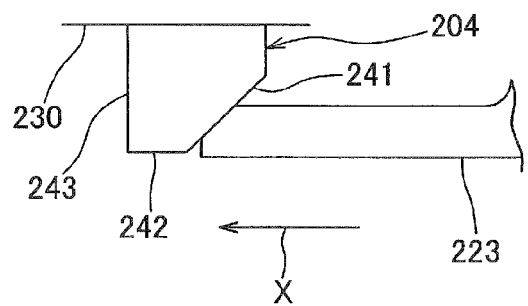
[FIG. 10A]
Figure 10B:
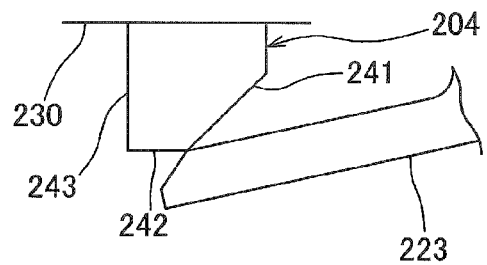
[FIG. 10B]
Figure 10C:
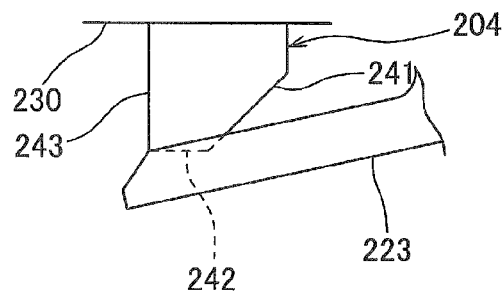
[FIG. 10C]
Figure 10D:
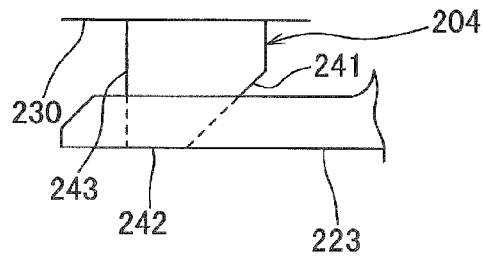
[FIG. 10D]

The locking arm 23 is extended in a plate shape from one attaching portion 21 toward the first connector fitting portion 11. A rectangular though-hole 24 is provided on the center of the locking arm 23. Further, an outer surface of the first connector fitting portion 11, namely, an outer surface of the connector housing 11a is provided with a locking projection 4 with which the locking arm 23 is locked when the sliding member 2 is positioned in the first position. In the present invention, as shown in FIG. 8, to position the locking projection 4 in the through-hole is referred to as "the locking arm 23 is locked with the locking projection". When the locking arm 23 is locked with the locking projection 4, the sliding member 2 is fixed to the first position.

Further, as shown in FIG. 1, an outer surface of the second connector fitting portion 12, namely, an outer surface of the connector housing 12a is provided with a temporary locking projection 5 with which the locking arm 23 is temporarily locked when the sliding member 2 is positioned in the second position. A projection length of the temporary locking projection 5 from the outer surface of the connector housing 12a is smaller than a projection length of the locking projection 4 from the outer surface of the connector housing 11a. Further, the outer surface of the connector housing 11a on which the locking projection 4 is provided is positioned in the same plane as the outer surface of the connector housing 12a on which the temporary locking projection 5 is provided. It is necessary to bend the locking arm 23 with large force for releasing the lock between the locking projection 4 and the locking arm 23. The temporary lock between the temporary locking projection 5 and the locking arm 23 can be canceled with less force than the large force.

Figure 5:
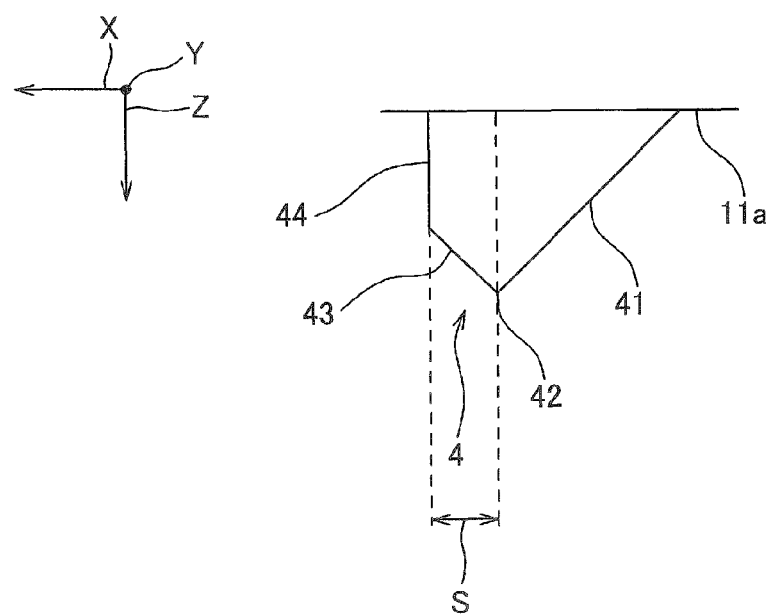
[FIG. 5]

As shown in FIG. 5, the locking projection 4 is projected in the arrow Z direction from the outer surface of the first connector fitting portion 11, namely, the outer surface of the connector housing 11a. This locking projection 4 includes: a first inclined wall 41 inclined in a direction away from the outer surface of the first connector fitting portion 11 as extended toward the first connector fitting portion 11 from the second connector fitting portion 12; a second inclined wall 43 continued to the first inclined wall 41 and inclined in a direction approaching the outer surface of the first connector fitting portion 11 as extended toward the first connector fitting portion 11 from the second connector fitting portion 12; and a third wall 44 continued to the second inclined wall 43 and perpendicular to the outer surface of the first connector fitting portion 11. Further, reference sign 42 denotes a most projected portion of the locking projection 4, namely, a top of the locking projection 4.

Figure 6:
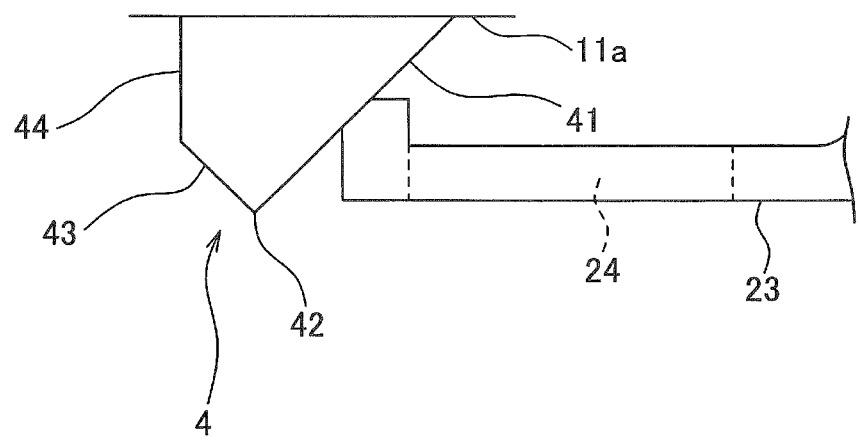
[FIG. 6]
Figure 7:
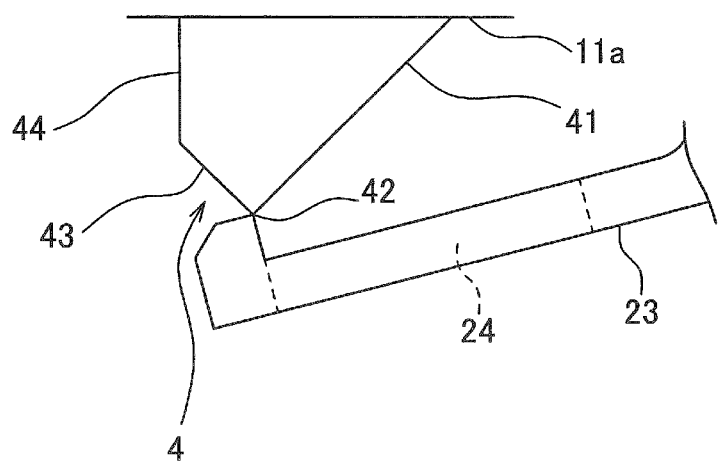
[FIG. 7]

When the sliding member 2 is slid from the second position to the first position, firstly, as shown in FIG. 6, a tip of the locking arm 23 is slid on the first inclined wall 41 of the locking projection 4, then, as shown in FIG. 7, the tip of the locking arm 23 overrides the top 42 of the locking projection 4 and is slid on the second inclined wall 43, and then, as shown in FIG. 8, the locking arm 23 is locked with the locking projection 4.

When the electrical junction box 1 is assembled, firstly, while the sliding member 2 is positioned in the second position, the first connector 7 is inserted into and fitted to the first connector fitting portion 11. Next, the temporary lock between the temporary locking projection 5 and the locking arm 23 is released, the sliding member 2 is positioned in the first position, and the locking arm 23 is locked with the locking projection 4. Then, the second connector 8 is inserted into and fitted to the second connector fitting portion 12.

Further, the electrical junction box 1 of the present invention is so formed that when the first connector 7 is fitted halfway to the first connector fitting portion 11, the locking arm 23 cannot positioned in the first position and on the second inclined wall 43, and when the locking arm 23 is positioned on the first inclined wall 41, the second connector 8 cannot be inserted into the second connector fitting portion 12.

According to such a electrical junction box 1, in a case that the sliding member 2 is slid from the second position to the first position, while the locking arm 23 is positioned on the first inclined wall 41, when the movement of the sliding member 2 is stopped, due to elastic restoring force of the bent locking arm 23 and to a guide of the first inclined wall 41, the sliding member 2 is moved to the second position side. Further, while the locking arm 23 is positioned on the second inclined wall 43, when the movement of the sliding member 2 is stopped, due to elastic restoring force of the bent locking arm 23 and to a guide of the second inclined wall 43, the sliding member 2 is moved to the first position side. In this way, in any case, because the locking arm 23 is not stopped on the locking projection 4, the half-locking condition of the sliding member is prevented.

Further, a slide length of the sliding member 2 needed for locking the locking arm 23 with the locking projection 4 is calculated after considering a bent length of the locking arm 23 stopped on the locking projection 4, designed clearance sizes of the sliding member 2, the connector housings 11*a*, 12*a*, dimension errors of the sliding member 2, the connector housings 11*a*, 12*a*, and the like. However, according to the present invention, the sliding member 2 is automatically moved to the first position side as long as the locking arm 23 is positioned on the second inclined wall 43, namely, as long as the locking arm 23 is positioned within a range S of FIG. 5. Therefore, the slide length of the sliding member 2 needed for locking the locking arm 23 with the locking projection 4 can be decided roughly. Therefore, a margin can be added to the design of each component.

Incidentally, the above embodiment only shows a representative example of the present invention. The present invention is not limited to the embodiment. Namely, various modifications can be practiced within a scope of the present invention.

REFERENCE SIGNS LIST

1 electrical junction box
2 sliding member
3 locking projection
7 first connector
11 first connector fitting portion
12 second connector fitting portion
23 locking arm
41 first inclined wall
43 second inclined wall
44 third wall

The invention claimed is:

1. An electrical junction box comprising:
   a first connector fitting portion configured to be fitted to a first connector;
   a second connector fitting portion configured to be fitted to a second connector;
   said first and second connector being arranged in one direction, and
   a sliding member attached to an outer surface of the first fitting portion and an outer surface of the second fitting portion in a manner slidable in the one direction,
   wherein the sliding member is slidable between a second position where the first connector is allowed to be inserted into the first connector fitting portion, and the second connector is prevented from being inserted into the second connector fitting portion, and a first position where the first connector regularly fitted to the first connector fitting portion is held between the sliding member and the first connector fitting portion, and the second connector is allowed to be inserted into the second connector fitting portion,
   wherein a locking projection with which a locking arm provided on the sliding member is locked is provided on the outer surface of the first connector fitting portion, and
   wherein the locking projection includes:
   a first inclined wall inclined in a direction away from the outer surface of the first connector fitting portion as extended toward the first connector fitting portion from the second connector fitting portion;
   a second inclined wall continued to the first inclined wall and inclined in a direction approaching the outer surface of the first connector fitting portion as extended toward the first connector fitting portion from the second connector fitting portion; and
   a third wall continued to the second inclined wall and perpendicular to the outer surface of the first connector fitting portion.

2. The electrical junction box as claimed in claim 1,
   wherein when the first connector is fitted halfway to the first connector fitting portion, the locking arm cannot be positioned in the first position and on the second inclined wall, and
   wherein when the locking arm is positioned on the first inclined wall, the second connector cannot be inserted into the second connector fitting portion.

\* \* \* \* \*